(12) United States Patent
Feng et al.

(10) Patent No.: US 11,088,178 B2
(45) Date of Patent: Aug. 10, 2021

(54) ARRAY SUBSTRATE, DISPLAY PANEL AND DISPLAY DEVICE

(71) Applicants: Beijing BOE Optoelectronics Technology Co., Ltd., Beijing (CN); BOE Technology Group Co., Ltd., Beijing (CN)

(72) Inventors: Dawei Feng, Beijing (CN); Yue Li, Beijing (CN); Yu Zhao, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 35 days.

(21) Appl. No.: 16/666,569

(22) Filed: Oct. 29, 2019

(65) Prior Publication Data

US 2020/0273885 A1     Aug. 27, 2020

(30) Foreign Application Priority Data

Feb. 27, 2019   (CN) .......................... 201910145555.8

(51) Int. Cl.
   *H01L 27/12*         (2006.01)
(52) U.S. Cl.
   CPC ........ *H01L 27/124* (2013.01); *H01L 27/1255* (2013.01)

(58) Field of Classification Search
None
See application file for complete search history.

(56) References Cited

U.S. PATENT DOCUMENTS

| 2009/0135125 | A1* | 5/2009 | Park | G02F 1/136286 |
| --- | --- | --- | --- | --- |
| | | | | 345/98 |
| 2014/0111722 | A1* | 4/2014 | Chen | G02F 1/133 |
| | | | | 349/43 |
| 2015/0092134 | A1* | 4/2015 | Jiang | G02F 1/1368 |
| | | | | 349/46 |
| 2017/0219890 | A1* | 8/2017 | Li | H01L 27/1255 |
| 2018/0053795 | A1* | 2/2018 | Lan | G02F 1/136286 |

* cited by examiner

*Primary Examiner* — Khaja Ahmad

(74) *Attorney, Agent, or Firm* — Arent Fox LLP; Michael Fainberg

(57) ABSTRACT

An array substrate, a display panel, and a display device are provided. The array substrate includes: a plurality of pixel zones in an array on a base substrate, where each pixel zone includes a pixel electrode, a common electrode, a compensation electrode, and a control circuit. The compensation electrode is insulated from the common electrode, the orthographic projection of the compensation electrode on the base substrate has an overlap area with the orthographic projection of the pixel electrode on the base substrate, and the orthographic projection of the common electrode on the base substrate has an overlap area with the orthographic projection of the pixel electrode on the base substrate; and the control circuit is configured to connect the pixel electrode with the compensation electrode while the pixel electrode is being charged.

11 Claims, 5 Drawing Sheets

ARRAY SUBSTRATE, DISPLAY PANEL AND DISPLAY DEVICE

CROSS-REFERENCES TO RELATED APPLICATION

This application claims priority to Chinese patent application No. 201910145555.8 filed on Feb. 27, 2019, which is incorporated herein by reference in its entirety.

FIELD

The present disclosure relates to the field of display technologies, and particularly to an array substrate, a display panel, and a display device.

BACKGROUND

With the development of the display technologies, there is a demand for a higher display quality of a display panel, but driving voltage for the display panel to display an image may vary due to an internal structure of the display panel, thus distorting the displayed image.

An array substrate in the display panel in the related art includes Thin Film Transistors (TFTs), where a parasitic capacitor may be formed between a source electrode and a gate of a TFT, and a parasitic capacitor may also be formed between a drain electrode and the gate of the TFT; and when a gate line on a base substrate is turned-on and turned-off, voltage at the gate of the TFT may vary, so voltage at the source electrode and the drain electrode may vary due to a coupling effect of the capacitors, so that voltage on a pixel electrode may vary, thus degrading an expected charging effect, and distorting an image.

SUMMARY

In one aspect, an embodiment of the disclosure provides an array substrate. The array substrate includes a plurality of gate lines, a plurality of data lines, and a plurality of pixel zones defined by the gate lines and the data lines crossing, wherein each pixel zone includes a first transistor, a pixel electrode, a common electrode, a compensation electrode, and a control circuit on a base substrate. The first transistor has a gate connected with one of the gate lines, a first electrode connected with one of the data lines, and a second electrode connected with the pixel electrode, the compensation electrode is insulated from the common electrode, the orthographic projection of the compensation electrode on the base substrate has an overlap area with the orthographic projection of the pixel electrode on the base substrate, and the orthographic projection of the common electrode on the base substrate has an overlap area with the orthographic projection of the pixel electrode on the base substrate; and the control circuit is configured to connect the pixel electrode with the compensation electrode in a charging stage of the pixel electrode, and to disconnect the pixel electrode from the compensation electrode in a non-charging stage of the pixel electrode.

In a possible implementation, in the array substrate above according to the embodiment of the disclosure, the control circuit includes a switch element, wherein the switch element has a control terminal connected with the gate line, a signal input terminal connected with the pixel electrode, and a signal output terminal connected with the compensation electrode; and the first transistor and the switch element in the same pixel zone are connected with the same gate line.

In a possible implementation, in the array substrate above according to the embodiment of the disclosure, the switch element includes a second transistor, wherein the second transistor has a gate connected with the gate line, a first electrode connected with the pixel electrode, and a second electrode connected with the compensation electrode.

In a possible implementation, in the array substrate above according to the embodiment of the disclosure, the orthographic projection of the compensation electrode on the base substrate does not overlap with the orthographic projection of the common electrode on the base substrate.

In a possible implementation, in the array substrate above according to the embodiment of the disclosure, the compensation electrode is at the same layer as the common electrode.

In a possible implementation, in the array substrate above according to the embodiment of the disclosure, the material of the compensation electrode is the same as the material of the common electrode.

In a possible implementation, in the array substrate above according to the embodiment of the disclosure, the orthographic projection of the pixel electrode on the base substrate covers the orthographic projection of the common electrode on the base substrate and the orthographic projection of the compensation electrode on the base substrate.

In a possible implementation, in the array substrate above according to the embodiment of the disclosure, the area of the compensation electrode is larger than the area of the common electrode.

In a possible implementation, in the array substrate above according to the embodiment of the disclosure, the area of the compensation electrode is twice to five times the area of the common electrode.

In another aspect, an embodiment of the disclosure further provides a display panel including the array substrate above according to the embodiment of the disclosure.

In further aspect, an embodiment of the disclosure further provides a display device including the display panel above according to the embodiment of the disclosure.

In a possible implementation, in the display device above according to the embodiment of the disclosure, the display device includes electronic paper.

DETAILED DESCRIPTION

Figure 1:
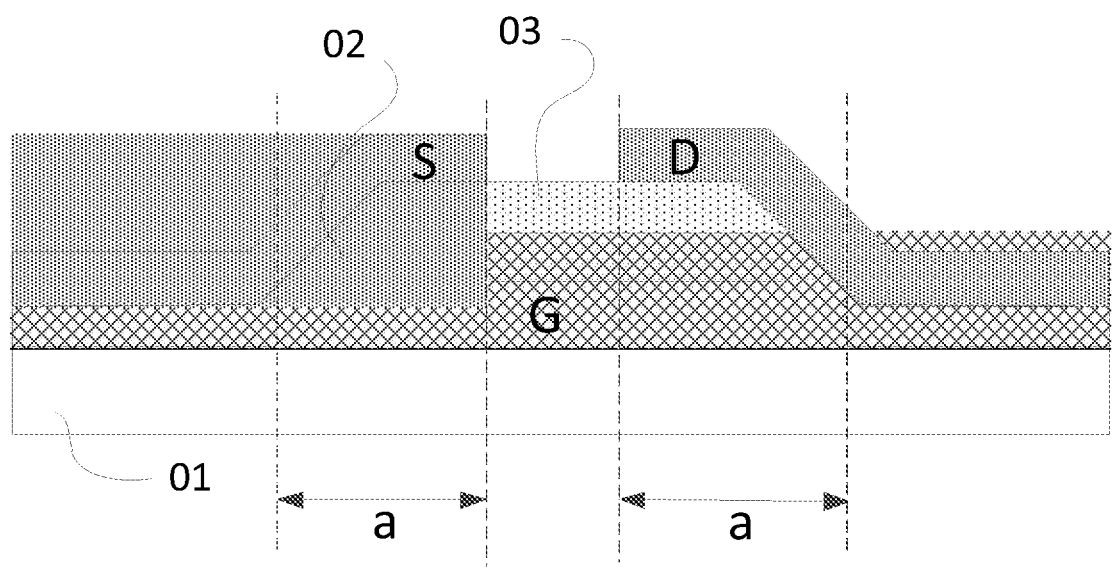
FIG. 1 is a schematic structural diagram of a transistor on an array substrate in the related art.
Figure 2:
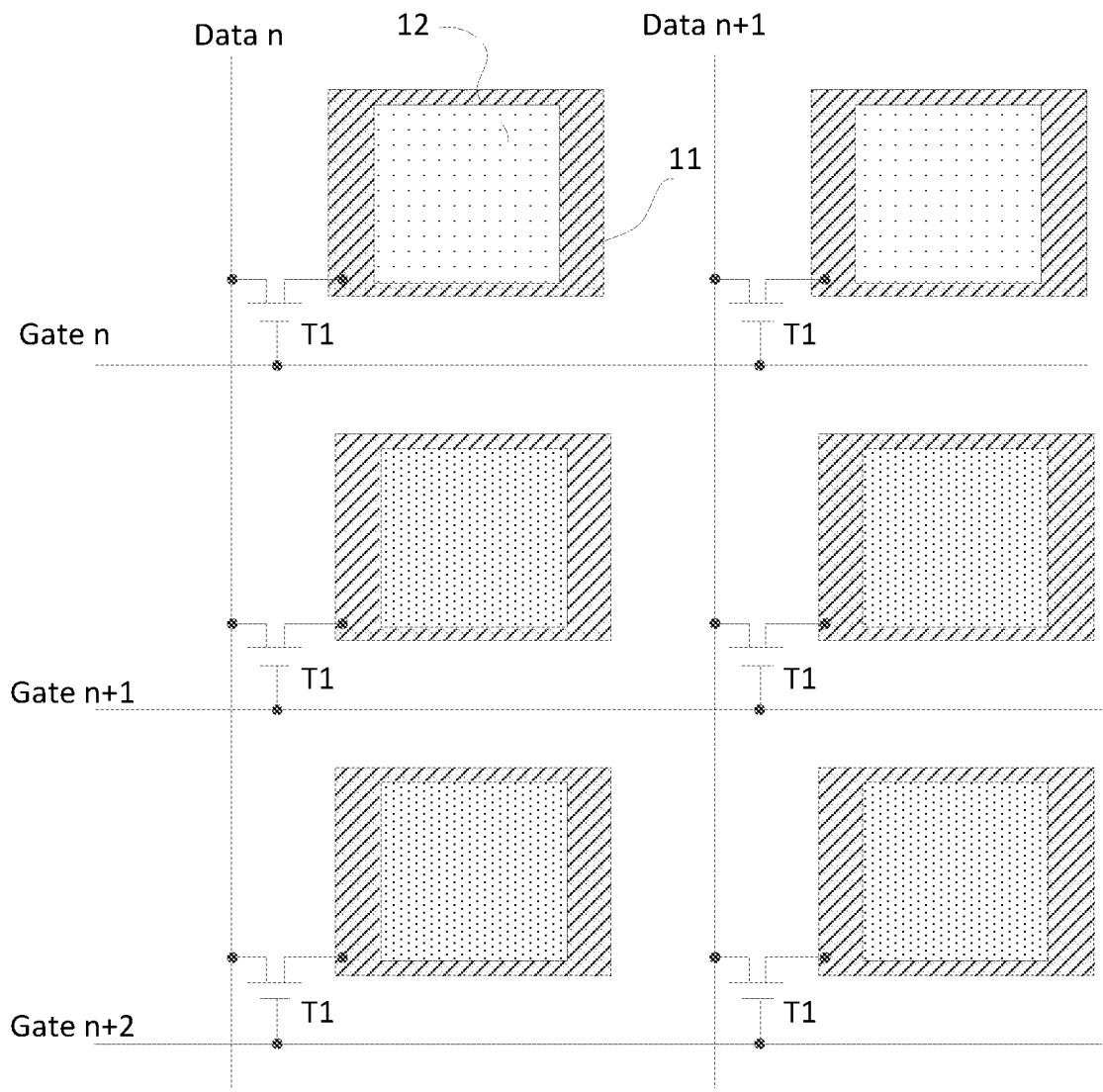
FIG. 2 is a schematic structural diagram of the array substrate in the related art.

The inventors have identified that, in the related art, as illustrated in FIG. 1 and FIG. 2, an array substrate includes a plurality of pixel zones arranged in an array, where each pixel zone includes a pixel electrode 11, a common electrode 12, and a first transistor T1. The first transistor T1 includes a gate G, a gate insulation layer 02, a semiconductor layer 03, source electrode S and drain electrode D on the base substrate 1. The first transistor T1 has a gate G connected with a gate line Gate, a source electrode S connected with the pixel electrode 11, and a drain electrode D connected with a data line Data, the orthographic projection of the common electrode 12 on the base substrate 01 has an overlap area with the orthographic projection of the pixel electrode 11 on the base substrate 01, and a fixed voltage signal, e.g., a common voltage signal VCOM, is applied to the common electrode 12. Since the gate G of the first transistor T1, has an overlap areas "a" with the source electrode S and the drain electrode D thereof, a first parasitic capacitor $C_{gs}$ is formed between the source electrode S and the gate G, and a second parasitic capacitor $C_{gd}$ is formed between the drain electrode D and the gate G; when the gate line G on the base substrate 01 is turned on and off, voltage at the gate G of the first transistor T1 may vary, so voltage at the source electrode S and the drain electrode D may vary due to a coupling effect of the capacitors. Since the pixel electrode 11 is connected with the source electrode 5, the voltage at the source electrode S may vary so that voltage on the pixel electrode 11 may vary. Specifically the voltage on the pixel electrode 11 may drop by $\Delta V_p=(V_{off}-V_{on})C_{gs}/(C_{gs}+C_{st1})$, where $V_{off}$ represents voltage when the gate line is turned off, $V_{on}$ represents voltage when the gate line is turned on, $C_{st1}$ represents the capacitance of a storage capacitor formed between the common electrode and the pixel electrode, and $C_{gs}$ represents the capacitance of a parasitic capacitor between the gate of the first transistor and the source electrode.

As can be apparent from the description above, the coupling capacitor exits between the source electrode and the gate, so a charging potential of the pixel electrode may be lowered directly, thus degrading a pre-charging effect, and consequentially degrading the display quality of a display panel.

In view of the problem in the related art, the embodiments of the disclosure provide an array substrate, a display panel, and a display device, so as to alleviate the problem in the related art that the pixel electrode may be charged insufficiently, thus distorting the image displayed on the display panel.

In order to make the objects, technical solutions, and advantages of the disclosure more apparent, the disclosure will be described below in further details with reference to the drawings. Apparently the embodiments to be described are only a part but not all of the embodiments of the disclosure. Based upon the embodiments here of the disclosure, all of other embodiments which can occur to those ordinarily skilled in the art without any inventive effort shall come into the claimed scope of the disclosure.

The shapes and sizes of respective components in the drawings are not intended to reflect any real proportion, but only intended to illustrate the disclosure.

Implementations of the array substrate, the display panel, and the display device according to the embodiments of the disclosure will be described below in details with reference to the drawings.

Figure 3:
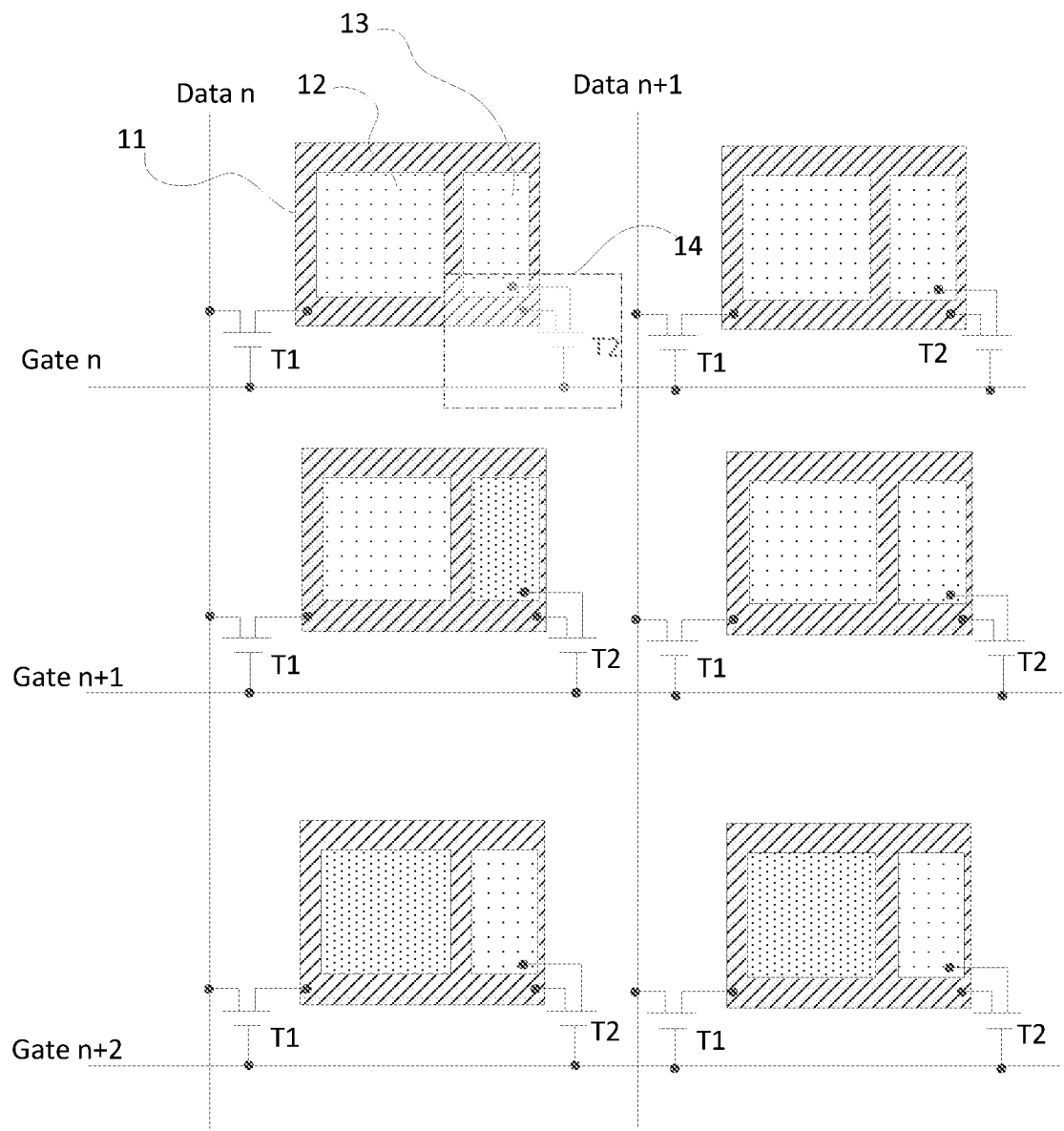
FIG. 3 is a first schematic structural diagram of an array substrate in accordance with an embodiment of the disclosure.

An embodiment of the disclosure provides an array substrate. As illustrated in FIG. 3, the array substrate includes gate lines Gate, data lines Data, and a plurality of pixel zones defined by the gate lines Gate, and the data lines Data crossing. Each pixel zone includes a transistor T1, a pixel electrode 11, a common electrode 12, a compensation electrode 13, and a control circuit 14 located on a base substrate.

The first transistor T1 has a gate connected with one of the gate lines Gate, a first electrode connected with one of the data lines Data, and a second electrode connected with the pixel electrode 11.

The compensation electrode 13 is insulated from the common electrode 12, the orthographic projection of the compensation electrode 13 on the base substrate has an overlap area with the orthographic projection of the pixel electrode 11 on the base substrate, and the orthographic projection of the common electrode 12 on the base substrate has an overlap area with the orthographic projection of the pixel electrode 11 on the base substrate.

The control circuit 14 is configured to connect the pixel electrode 11 with the compensation electrode 13 in a charging stage of the pixel electrode 11, and to disconnect the pixel electrode 11 from the compensation electrode 13 in a non-charging stage of the pixel electrode 11.

Figure 4:
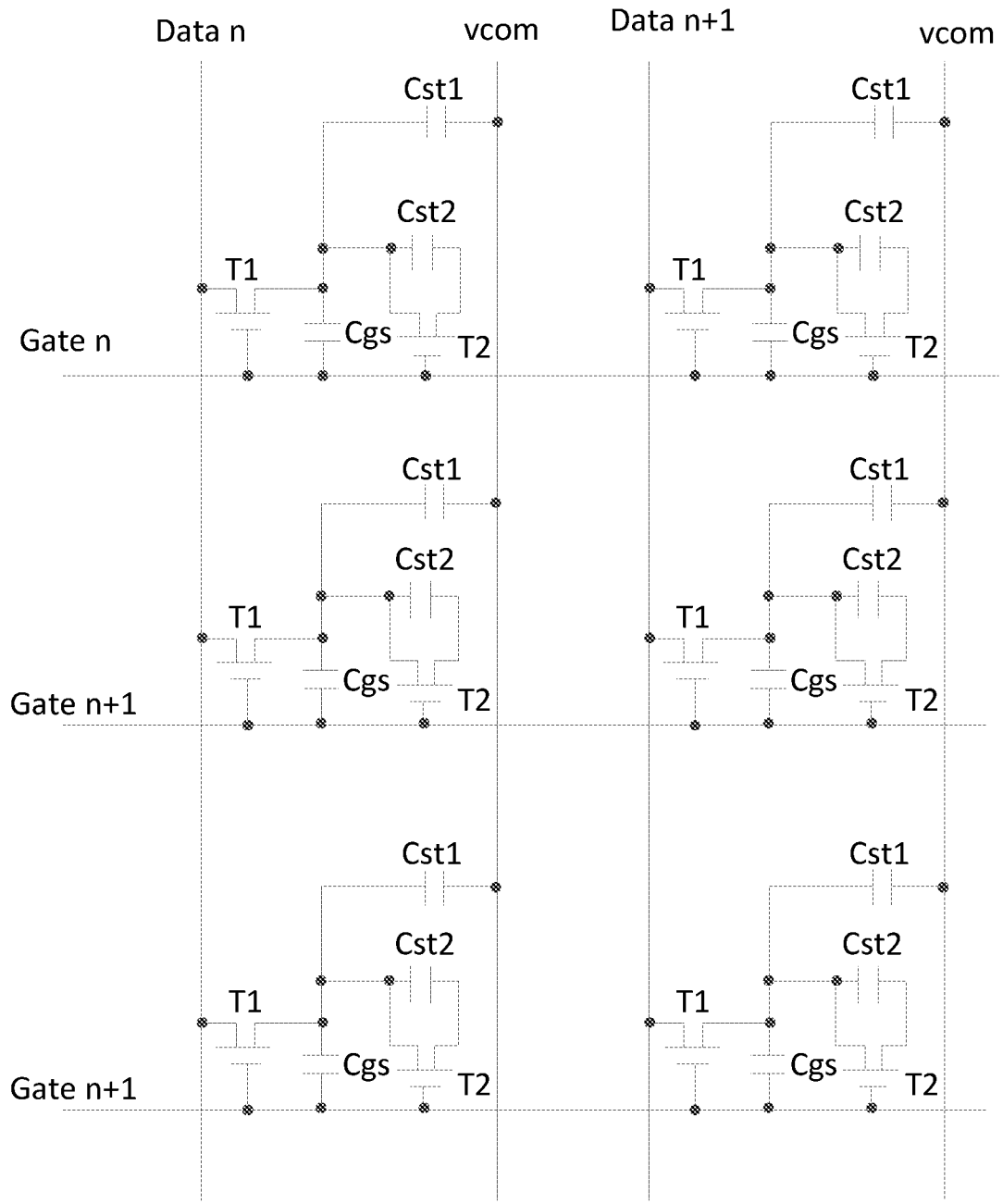
FIG. 4 is a schematic circuit structural diagram corresponding to FIG. 3.

Specifically in the array substrate according to the embodiment of the disclosure, as illustrated in FIG. 3 and FIG. 4, when a signal is input on the gate line Gate corresponding to the pixel zone, the first transistor T1 charges the pixel electrode 11 using a signal applied on the data line Data under the control of the signal applied on the gate line Gate, and at this time, the control electrode 14 connects the pixel electrode 11 with the compensation electrode 13 so that there is the same voltage on the pixel electrode 11 and the compensation electrode 13, and in this stage, a first storage capacitor $C_{st1}$ is formed between the pixel electrode 11 and the common electrode 12. When the signal is stopped from being applied on the gate line Gate corresponding to the pixel zone, the signal on the data line Data is stopped from being provided to the pixel electrode 11, under the control of the first transistor T1, the pixel electrode 11 enters a capacitor coupled state, the pixel electrode 11 is disconnected from the compensation electrode 13 under the control of the control circuit 14, the compensation electrode 13 is floating, and in this stage, the first storage capacitor $C_{st1}$ is formed between the pixel electrode 11 and the common electrode 12, and a second storage capacitor $C_{st2}$ is formed between the pixel electrode 11 and the compensation electrode 13. In summary, the capacitance of the storage capacitor is the capacitance of the first storage capacitor $C_{st1}$ in the charging stage of the pixel electrode, and the sum of the capacitance of the first storage capacitor $C_{st1}$, and the capacitance of the second storage capacitor $C_{st2}$, so apparently the capacitance of the storage capacitor in the discharging stage of the pixel electrode is larger than the capacitance of the storage capacitor in the charging stage of the pixel electrode; and voltage on the pixel electrode 11 drops by $\Delta V_p=(V_{off}-V_{on})C_{gs}/(C_{gs}+C_{st1}+C_{st2})$, so apparently the voltage on the pixel electrode 11 will drop less, thus improving the voltage retaining capability of the pixel electrode 11 so as to improve the display effect of the display panel.

Specifically in the array substrate according to the embodiment of the disclosure, the array substrate includes: a plurality of pixel zones in an array on a base substrate, where each pixel zone includes a pixel electrode, a common electrode, a compensation electrode, and a control circuit; the compensation electrode is insulated from the common electrode, the orthographic projection of the compensation electrode on the base substrate has an overlap area with the orthographic projection of the pixel electrode on the base substrate, and the orthographic projection of the common electrode on the base substrate has an overlap area with the orthographic projection of the pixel electrode on the base substrate; and the control circuit is configured to connect the pixel electrode with the compensation electrode while the pixel electrode is being charged. The compensation electrode and the control circuit are configured so that when the compensation electrode is disconnected from the pixel electrode, capacitors are formed between the compensation electrode and the pixel electrode, and between the common electrode and the pixel electrode, so that voltage on the pixel electrode can be made stable due to a larger capacitance to thereby improve the display quality.

It shall be noted that FIG. 3 illustrates the common electrode 12 arranged at the same layer as the compensation electrode 13 by way of an example. In a specific implementation, the compensation electrode can alternatively be arranged at the same layer as another layer than the common electrode as long as there is an overlapping area between the orthographic projection of the compensation electrode on the base substrate and the orthographic protection of the pixel electrode on the base substrate. Optionally the compensation electrode can be arranged at the same layer as a layer having conductivity so that a storage capacitor is formed between the compensation electrode and the pixel electrode. Furthermore the vertical distance between the compensation electrode and the pixel electrode can be set shorter than the vertical distance between the common electrode and the pixel electrode to thereby increase the storage capacity of the storage capacitor formed between the compensation electrode and the pixel electrode so as to further improve the voltage retaining capability of the pixel electrode.

In some embodiments of the disclosure, in the array substrate, the control circuit includes a switch element. The switch element has a control terminal connected with the gate line, a signal input terminal connected with the pixel electrode, and a signal output terminal connected with the compensation electrode.

The first transistor and the switch element in the same pixel zone are connected with the same gate line.

In some embodiments of the disclosure, in the array substrate, as illustrated in FIG. 3 and FIG. 4, the switch element includes a second transistor T2. The second transistor T2 has a gate connected with the gate line Gate, a first electrode connected with the pixel electrode 11, and a second electrode connected with the compensation electrode 13.

Specifically in the array substrate according to the embodiment of the disclosure, when a signal is applied on the gate line, both the first transistor and the second transistor are turned on, so that the first transistor is turned on to provide the pixel electrode with a data signal on the data line, and the second transistor is turned on to provide the compensation voltage with voltage on the pixel electrode, where the first transistor and the second transistor are of the same type, and both of them can be N-type transistors or P-type transistors, although the embodiment of the disclosure will not be limited thereto.

It shall be noted that the switch element can alternatively be another element which can perform a switch function, instead of a transistor, although the embodiment of the disclosure will not be limited thereto.

In some embodiments of the disclosure, in the array substrate, the orthographic projection of the compensation electrode on the base substrate does not overlap with the orthographic projection of the common electrode on the base substrate.

Specifically in the array substrate according to the embodiment of the disclosure, the orthographic projection of the compensation electrode on the base substrate does not overlap with the orthographic projection of the common electrode on the base substrate; otherwise, their overlapping area, and the storage capacitor formed between the compensation electrode and the pixel electrode may be affected by each other.

In some embodiments of the disclosure, in the array substrate, as illustrated in FIG. 3, the compensation electrode 13 is arranged at the same layer as the common electrode 12.

Specifically in the array substrate according to the embodiment of the disclosure, when the compensation electrode is arranged at the same layer as the common electrode, they can be formed using the same mask, so no additional formation process will be performed, and a production cost can be saved.

In some embodiments of the disclosure, in the array substrate, the compensation electrode and the common electrode are metal electrodes or transparent electrodes.

Specifically in the array substrate according to the embodiment of the disclosure, the compensation electrode and the common electrode can be metal electrodes so that the storage capacitors are formed between the compensation electrode and the pixel electrode, and between the common electrode and the pixel electrode. In order to avoid the compensation electrode and the common electrode from affecting an opening ratio of the display panel, the compensation electrode and the common electrode can alternatively be transparent electrodes. The compensation electrode and the common electrode can be selected as needed in reality, and will not be limited to any specific electrodes in the embodiment of the disclosure.

In some embodiments of the disclosure, in the array substrate, the orthographic projection of the pixel electrode on the base substrate covers the orthographic projection of the common electrode on the base substrate and the orthographic projection of the compensation electrode on the base substrate.

Specifically in the array substrate according to the embodiment of the disclosure, the pixel electrode fully covers the common electrode and the compensation electrode so that the sum of the capacitances of the storage capacitors formed between the pixel electrode and the common electrode and between the pixel electrode and the compensation electrode can be increased while improving an opening ratio of the pixel, to thereby further improve the voltage retaining capability of the pixel electrode.

Figure 5:
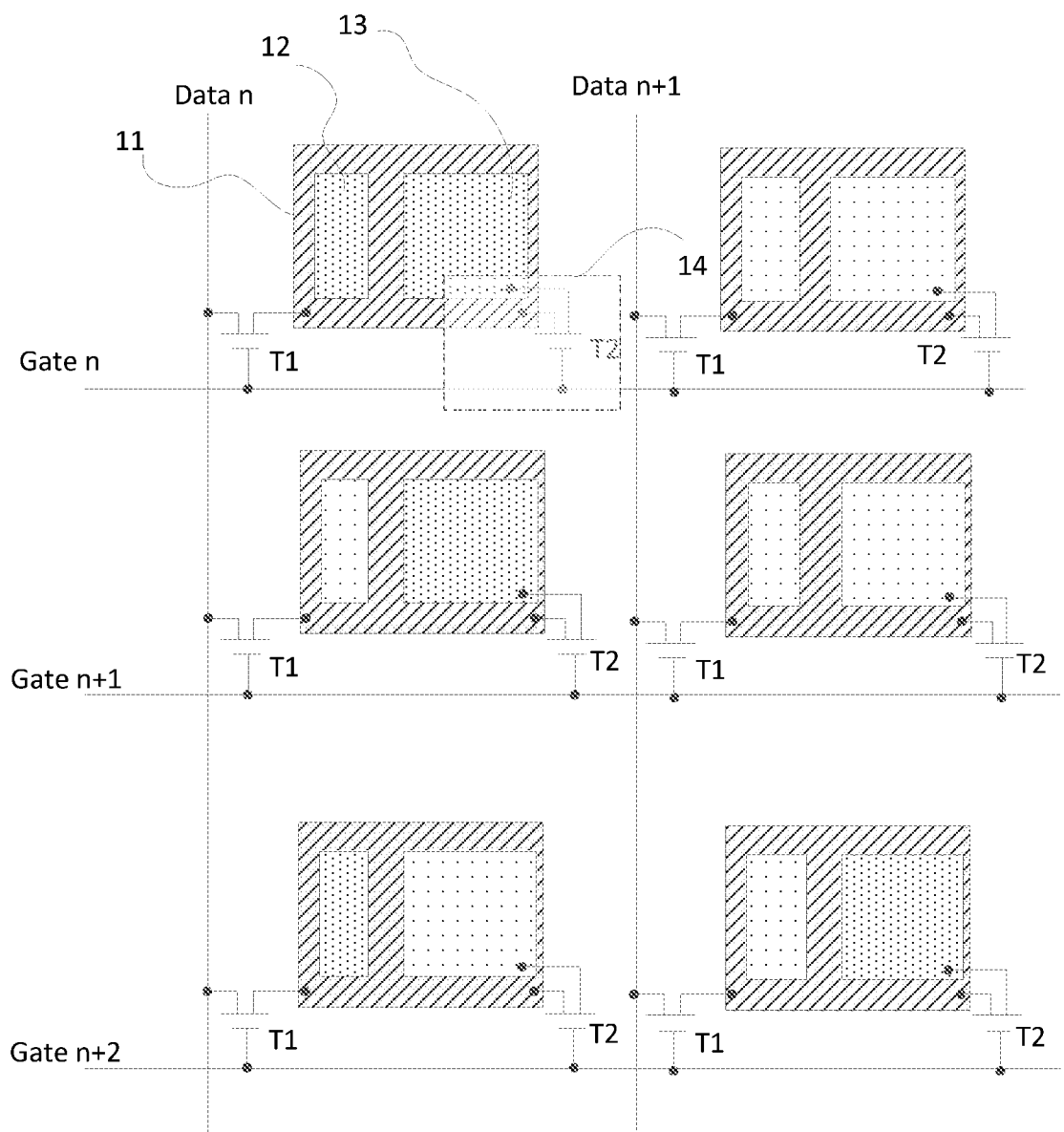
FIG. 5 is a second schematic structural diagram of an array substrate in accordance with an embodiment of the disclosure.

In some embodiments of the disclosure, in the array substrate, as illustrated in FIG. 5, the area of the compensation electrode 13 is larger than the area of the common electrode 12.

Specifically in the array substrate according to the embodiment of the disclosure, in the charging phase of the pixel, the storage capacitor formed between the pixel electrode and the common electrode may seriously affect the charging ratio of the pixel electrode in that the larger the capacitance of the storage capacitor formed between the pixel electrode and the common electrode, the lower the charging ratio of the pixel electrode is. Particularly in the high-resolution display panel, the charging time for the pixel electrode is significantly insufficient, and in order to improve the charging ratio of the pixel electrode, the area of the common electrode can be reduced as appropriate; and also in order not to lower the voltage of the pixel electrode, the area of the compensation electrode can be increased as appropriate so that the area of the compensation electrode is larger than the area of the common electrode.

In some embodiments of the disclosure, in the array substrate, the area of the compensation electrode is twice to five times the area of the common electrode.

Specifically in the array substrate according to the embodiment of the disclosure, when the area of the compensation electrode is twice to five times the area of the common electrode, the charging ratio of the pixel electrode can be improved differently, where the smaller the area of the common electrode, the higher the charging ratio of the pixel electrode is, so the area ratio between the common electrode and the compensation electrode can be adjusted as needed in reality, and will not be limited to any specific ratio in the embodiment of the disclosure.

Based upon the same inventive idea, an embodiment of the disclosure further provides a display panel including the array substrate according to any one of the embodiments above of the disclosure.

Specifically in the display panel according to the embodiment of the disclosure, the display panel can be a liquid crystal display panel, an OLED display panel, etc., although the embodiment of the disclosure will not be limited thereto.

Since the display panel addresses the problem under a similar principle to the array substrate above, reference can be made to the implementation of the array substrate above for an implementation of the display panel, so a repeated description thereof will be omitted here.

Based upon the same inventive idea, an embodiment of the disclosure further provides a display device including the display panel according to the embodiment above of the disclosure. Since the display device addresses the problem under a similar principle to the display panel above, reference can be made to the implementation of the display panel above for an implementation of the display device, so a repeated description thereof will be omitted here.

The display device can be a phone, a tablet computer, a TV set, a display, a notebook computer, a digital photo frame, a navigator, electronic paper, or any other product or component with a display function, although the embodiment of the disclosure will not be limited thereto.

It shall be noted that in the display device according to the embodiment of the disclosure, when the display device is electronic paper, the voltage on the pixel electrode drops by $\Delta V_p$ as defined in the equation of: $\Delta V_p = (V_{off} - V_{on})C_{gs}/(C_{gs} + C_{st1} + C_{st2} + C_{ep})$, where $C_{ep}$ represents the capacitance of a capacitor between the pixel electrode and a film electrode of the electronic paper.

In the array substrate, the display panel, and the display device above according to the embodiments of the disclosure, the array substrate includes a plurality of pixel zones arranged in an array on a base substrate, where each pixel zone includes a pixel electrode, a common electrode, a compensation electrode, and a control circuit. The compensation electrode is insulated from the common electrode, the orthographic projection of the compensation electrode on the base substrate has an overlap area with the orthographic projection of the pixel electrode on the base substrate, and the orthographic projection of the common electrode on the base substrate has an overlap area with the orthographic projection of the pixel electrode on the base substrate; and the control circuit is configured to connect the pixel electrode with the compensation electrode while the pixel electrode is being charged. The compensation electrode and the control circuit are arranged so that when the compensation electrode is disconnected from the pixel electrode, capacitors are formed between the compensation electrode and the pixel electrode, and between the common electrode and the pixel electrode, so that voltage on the pixel electrode can be made stable due to a larger capacitance to thereby improve the display quality.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. An array substrate, comprising
   a plurality of gate lines, a plurality of data lines, and a plurality of pixel zones are defined by the gate lines and the data lines crossing; wherein:
   each of the pixel zones comprises a first transistor, a pixel electrode, a common electrode, a compensation electrode, and a control circuit on a base substrate;
   the first transistor has a gate connected with one of the gate lines, a first electrode connected with one of the data lines, and a second electrode connected with the pixel electrode;
   the compensation electrode is insulated from the common electrode, an orthographic projection of the compensation electrode on the base substrate has an overlap area with an orthographic projection of the pixel electrode on the base substrate, and an orthographic projection of the common electrode on the base substrate has an overlap area with the orthographic projection of the pixel electrode on the base substrate;
   the control circuit is configured to connect the pixel electrode with the compensation electrode in a charging stage of the pixel electrode, and to disconnect the pixel electrode from the compensation electrode in a non-charging stage of the pixel electrode; and
   the control circuit comprises a switch element, wherein:
   the switch element has a control terminal connected with one of the gate lines, a signal input terminal connected with the pixel electrode, and a signal output terminal connected with the compensation electrode; and
   the first transistor and the switch element in a same pixel zone are connected with the same one of the gate lines.

2. The array substrate according to claim 1, wherein the switch element comprises a second transistor, wherein:
   the second transistor has a gate connected with one of the gate lines, a first electrode connected with the pixel electrode, and a second electrode connected with the compensation electrode.

3. The array substrate according to claim 1, wherein the orthographic projection of the compensation electrode on the base substrate does not overlap with the orthographic projection of the common electrode on the base substrate.

4. The array substrate according to claim 3, wherein the compensation electrode is at same layer as the common electrode.

5. The array substrate according to claim 4, wherein a material of the compensation electrode is same as a material of the common electrode.

6. The array substrate according to claim 4, wherein the orthographic projection of the pixel electrode on the base substrate covers the orthographic projection of the common electrode on the base substrate, and the orthographic projection of the compensation electrode on the base substrate.

7. The array substrate according to claim 4, wherein an area of the compensation electrode is larger than an area of the common electrode.

8. The array substrate according to claim 7, wherein the area of the compensation electrode is twice to five times the area of the common electrode.

9. A display panel, comprising the array substrate according to claim 1.

10. A display device, comprising the display panel according to claim 9.

11. The display device according to claim 10, comprising electronic paper.

* * * * *